United States Patent [19]

Tuthill

[11] 4,338,591
[45] Jul. 6, 1982

[54] HIGH RESOLUTION DIGITAL-TO-ANALOG CONVERTER

[75] Inventor: Michael G. Tuthill, Limerick, Ireland

[73] Assignee: Analog Devices, Incorporated, Norwood, Mass.

[21] Appl. No.: 272,053

[22] Filed: Jun. 9, 1981

[51] Int. Cl.³ .......................................... H03K 13/02
[52] U.S. Cl. ............................................ 340/347 DA
[58] Field of Search ... 340/347 DA, 347 M, 347 AD; 364/722, 718, 851, 852, 853

[56] References Cited

U.S. PATENT DOCUMENTS 3,441,835  4/1969  Hekrdle ................... 340/347 DA X
3,895,378  7/1975  Marcel ........................ 340/347 DA
3,997,892  12/1976 Susset ......................... 340/347 DA

OTHER PUBLICATIONS

Grzybowski, "Electronic Engineering", Jul. 1971, pp. 48–51.

Primary Examiner—Charles D. Miller
Attorney, Agent, or Firm—Parmelee, Bollinger & Bramblett

[57] ABSTRACT

A digital-to-analog converter capable of high resolution performance, e.g. for converting 16-bit digital signals, comprising a cascaded two-stage device wherein the first stage consists of a segment converter with a series-connected string of resistors and switches operable by a set of higher-order input bits for selecting the voltage across any one of the resistors, buffer amplifiers for directing the selected voltage to the input of a second-stage converter comprising a CMOS DAC with an R/2R ladder controlled by a set of lower order bits to interpolate between the limits of the selected voltage from the first stage, and wherein the switches for the first stage function to interchange the roles of the buffer amplifiers for each step up (or down) the resistor string so as to eliminate or minimize differential non-linearity errors due to offset mismatch between the buffer amplifiers.

6 Claims, 5 Drawing Figures

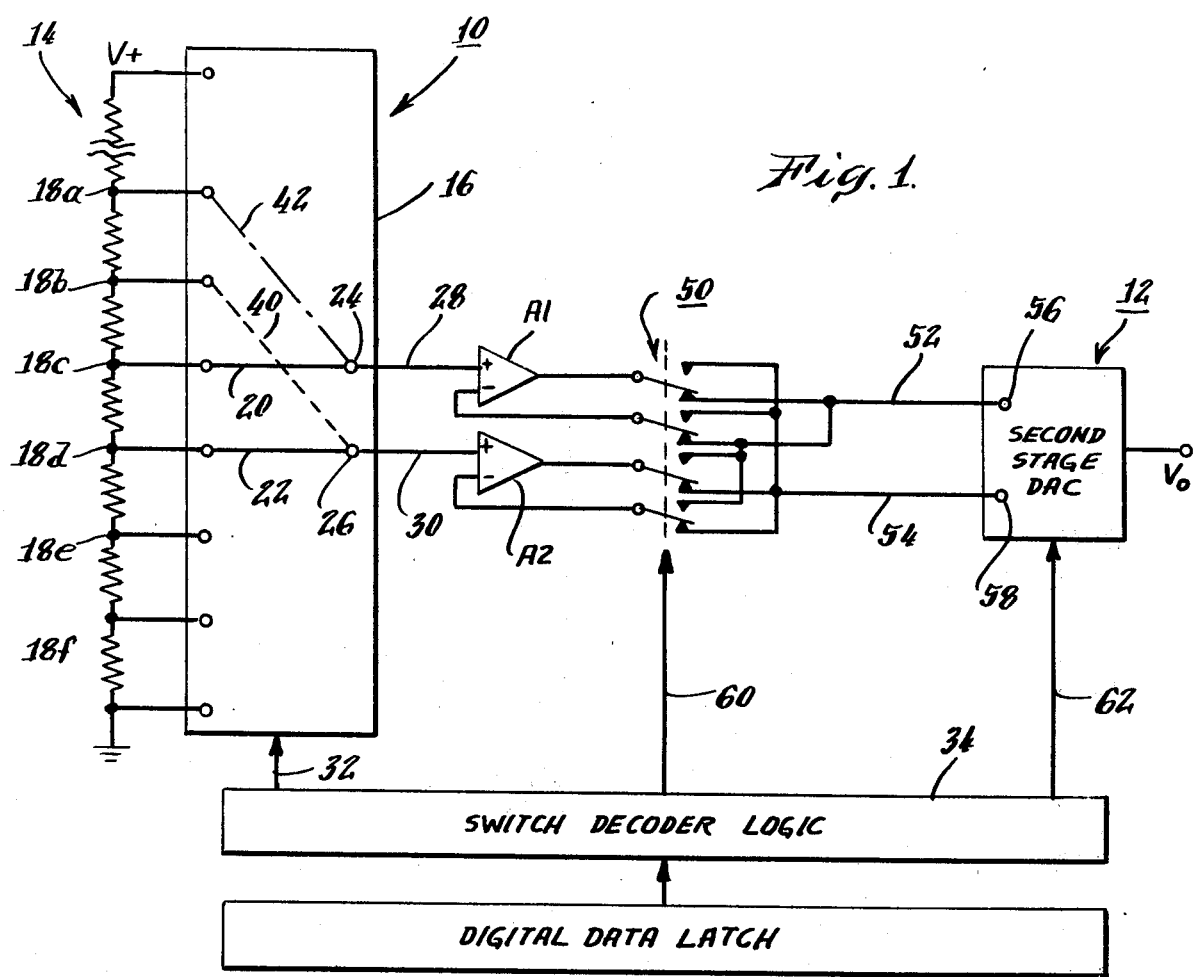
Fig. 1.
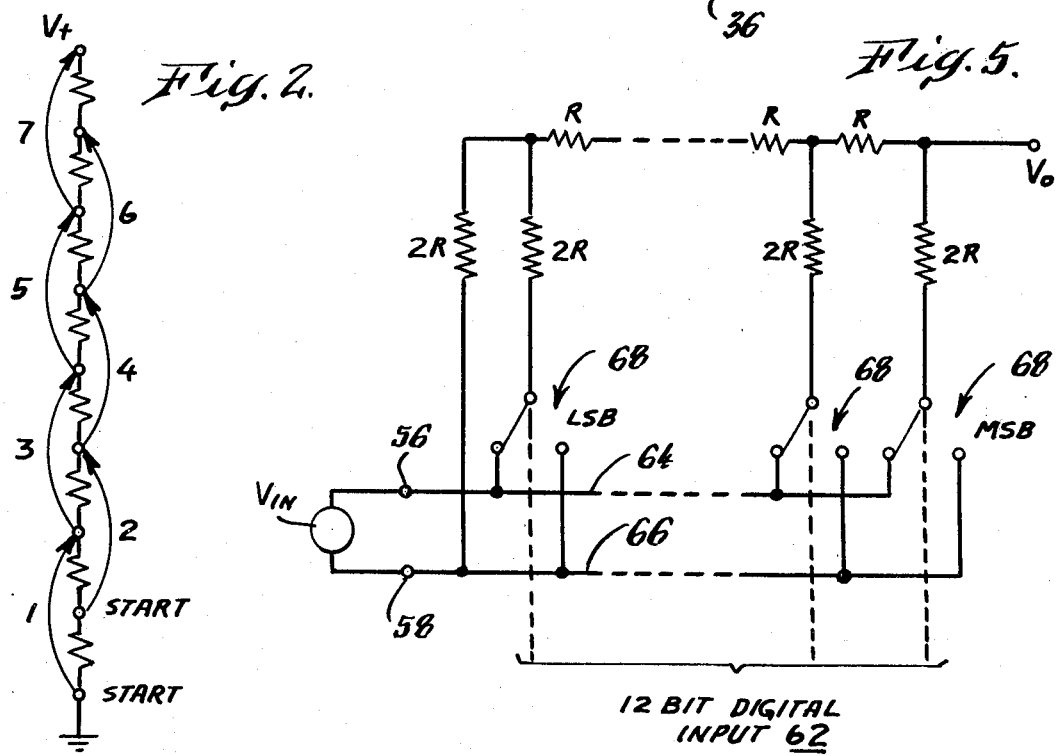
Fig. 2.
Fig. 5.

TRUTH TABLE FOR SWITCH DECODER

| DB15 | DB14 | DB13 | DB12 | SEGMENT SWITCHES | OUTPUT SWITCHES |
|---|---|---|---|---|---|
| 1 | 1 | 1 | 1 | S15, S16 | S18, S20 |
| 1 | 1 | 1 | 0 | S14, S15 | S17, S19 |
| 1 | 1 | 0 | 1 | S13, S14 | S18, S20 |
| 1 | 1 | 0 | 0 | S12, S13 | S17, S19 |
| 1 | 0 | 1 | 1 | S11, S12 | S18, S20 |
| 1 | 0 | 1 | 0 | S10, S11 | S17, S19 |
| 1 | 0 | 0 | 1 | S9, S10 | S18, S20 |
| 1 | 0 | 0 | 0 | S8, S9 | S17, S19 |
| 0 | 1 | 1 | 1 | S7, S8 | S18, S20 |
| 0 | 1 | 1 | 0 | S6, S7 | S17, S19 |
| 0 | 1 | 0 | 1 | S5, S6 | S18, S20 |
| 0 | 1 | 0 | 0 | S4, S5 | S17, S19 |
| 0 | 0 | 1 | 1 | S3, S4 | S18, S20 |
| 0 | 0 | 1 | 0 | S2, S3 | S17, S19 |
| 0 | 0 | 0 | 1 | S1, S2 | S18, S20 |
| 0 | 0 | 0 | 0 | S0, S1 | S17, S19 |

HIGH RESOLUTION DIGITAL-TO-ANALOG CONVERTER

BACKGROUND OF THE INVENTION

1. Field of the Invention

This invention relates to digital-to-analog converters (so-called DACs). More particularly, this invention relates to high-resolution converters, e.g. for converting 16-bit digital input signals into corresponding analog signals.

2. Desription of the Prior Art

There has been a growing need in recent years for high-resolution digital-to-analog converters. The resolution of known types of monolithic converters employing R/2R ladder seems to have reached an apparent practical limit of about 12 bits. Thus it has become necessary to look for other solutions to the problem.

It has been recognized that in some applications, absolute accuracy in digital-to-analog converters is less important than good differential linearity and guaranteed monotonic behavior. Superior performance in such respects can be achieved by segment-type DACs comprising strings of series-connected resistors with switches to make connection to selected nodal points of the string.

Segment converters can be arranged in cascaded format, such that a first stage employing a resistor-string converter decodes a group of higher-order bits, and a second stage decodes the remaining, lower-order bits. A non-linear converter of that general type is shown in the article by Gryzbowski et al, "Non-linear Functions from D/A Converters", Electronic Engineering 1971, pp. 48-51. The converter disclosed in that article is designed for operation with relay switching, but is not readily adapted to modern semiconductor technology. U.S. Pat. No. 3,997,892 (Susset) shows a cascaded (non-linear) converter design intended for use with semiconductor switching. In this design, both the first and second stage comprise a resistor-string segment-type converter. The converter design includes buffer amplifiers to prevent the second-stage resistor string from loading the first-stage resistor string.

Although the prior art converters referred to above embody certain attractive aspects, they are not capable of the high-resolution performance now required in many applications. Thus it is an object of this invention to overcome the deficiencies of such prior art schemes.

SUMMARY OF THE INVENTION

In a preferred embodiment of the invention, to be described below in detail, there is provided a two-stage cascaded converter wherein the first stage comprises a series-connected resistor-string segment converter. Switch means are operable by higher-order bits of the digital input signal to step up or down the string of resistors, so as to make connections to the voltage across any selected one of the resistors of the string. As in the above-mentioned Susset U.S. Pat. No. 3,997,892, the voltage across the selected resistor of the string is, in turn, coupled through a pair of buffer amplifiers to the input terminals of the second-stage converter. This latter converter performs an interpolation within the selected voltage from the first stage, in accordance with a set of lower-order bits of the digital input signal.

In accordance with an important aspect of the invention, the roles of the buffer amplifiers are interchanged for each step up (or down) the resistor string of the first stage. This eliminates or minimizes any differential non-linearity errors due to offset mismatch between the buffer amplifiers, thereby making it possible to achieve exceptionally high-resolution performance while employing conventional components and processes.

When the digital input signal requires that the buffer amplifiers be shifted up from across one resistor of the string to the next resistor in the string, the switch system functions in a simple fashion to shift only one connection at a time, in a "leap frog" manner. That is, the connection from one buffer amplifier to one nodal point of the string is shifted to the nodal point next beyond that to which the other buffer amplifier is connected, while the connection of that other buffer amplifier to the resistor string remains unchanged. Thus the connections between the amplifiers and the resistor string are effectively reversed for each step by up or down the string, so as to minimize any adverse effects of offset mismatch between the amplifiers.

With this switch sequencing, it will be seen that the voltage between the inputs to the buffer amplifiers reverses polarity with each step up (or down) the resistor string. The correct polarity for the second-stage converter is restored by a reversing switch in the output circuitry of the buffer amplifiers, i.e. in a part of the circuit which is subsequent to the part involved in interchanging the buffer amplifier roles.

The reversing switch is operable by the digital input signal to reverse the connections between the amplifier outputs and the second-stage converter inputs for each step up (or down) the first-stage resistor string. This results in a uniform polarity relationship for the input voltage to the second-stage converter for all digital input signals.

As noted above, a special advantage of the described arrangement is that excellent differential non-linearity can be achieved without requiring unduly close specifications on the matching of the buffer amplifier offsets. Monotonic operation can be achieved with a specified differential non-linearity of less than ±1 LSB, and a converter of the present design can readily achieve high resolution performance while empboying only components and processing techniques within the current state of the art.

Still other aspects and advantages of the invention will be pointed out in, or apparent from, the following detailed description of a preferred embodiment of the invention, considered together with the accompanying drawings.

BRIEF DESCRIPTION OF THE DRAWINGS

FIG. 1 is a schematic diagram illustrating principles of the invention;

FIG. 2 is a diagram explaining the switching sequences in stepping up (or down) the first-stage resistor string;

FIG. 5 is a diagrammatic representation of the R/2R ladder of the second-stage converter.

DETAILED DESCRIPTION OF A PREFERRED EMBODIMENT

Figures 3, 4:
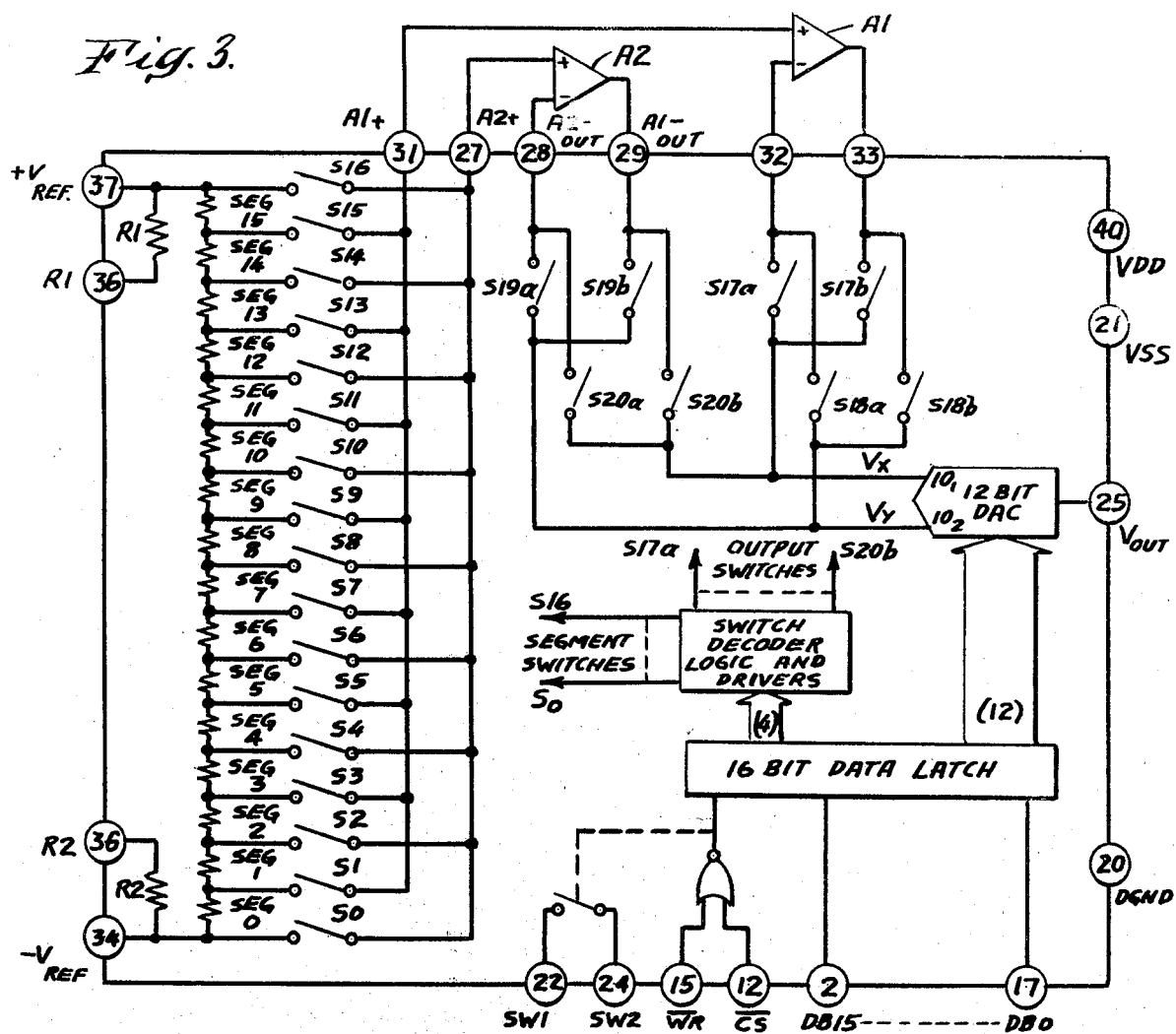
FIG. 3 is a schematic diagram showing details of a preferred embodiment of the invention.
FIG. 4 is a truth table for the switch decoder of FIG. 3.

Referring now to FIG. 1, there is shown a somewhat simplified version of a digital-to-analog converter of the cascade type, including a first stage converter 10 and a second stage converter 12. The first stage basically comprises a string of resistors 14, e.g. having equal ohmic resistances for linear conversion, and energized by a reference voltage labelled V+. A digitally-controlled switch system 16 operates to make selective connection to any adjacent pair of the successive nodal points 18 between the resistors.

In the setting of the switches 16 as shown, connections are made to nodal points 18c, 18d through switch lines 20, 22 (shown in solid outline). These lines connect to switch output terminals 24, 26 which are connected to respective reference leads 28, 30. These leads, in turn, are connnected directly to the input circuits of respective buffer amplifiers A1 and A2, and which drive the second converter stage 12 through a reversing switch as will be explained.

The switches 16 are operated by control signals represented by an arrow 32 and developed by switch decoder logic 34 from a set of higher order bits of the digital input signal applied to a digital latch 36. As the higher-order bits change, the switches 16 step the connections to the nodal points 18 up (or down) the string of resistors, in order to connect the voltage across any selected one of the string resistors to the two reference leads 28, 30. This stepping up (or down) the resistor string is effected in a manner such that only one connection is changed for each step.

For example, if the switches are to be stepped up one position from the solid-line setting shown (i.e. switch lines 20, 22), only the lower connection will be shifted. Thus, the connection of line 22 will be replaced by the connection shown by dashed line 40 from output terminal 26 to the nodal point 18b. That is, the connection originally made from terminal 26 to nodal point 18d will be shifted up to the nodal point which is next beyond the nodal point 18c to which the other terminal 24 is connected. The connection to that other terminal (solid line 20) remains unchanged in this step up the resistor string. If the switches 16 shift up still one more step, the original solid line connection 22 will be replaced by the connection 42, shown as a dashed line.

FIG. 2 has been included to give a somewhat pictorial presentation of the switching sequences involved in stepping up (or down) the resistor string. It will be seen that, from a "start" position at the bottom of the string, the switching sequence first advances the left-side connection (1), then the right-side connection (2), and so on up the chain. This procedure can be viewed as analogous to the way in which a person walks up stairs, each step taking the trailing leg one step beyond the fore leg. Thus, the procedure can be considered to be "walking up" the resistor string, or as a sequence somewhat akin to "leap frog".

By following such a procedure in the converter arrangement described, it will be seen that the roles of the buffer amplifiers A1, A2 are interchanged at each step as the switches "walk up" the resistor string. It can be shown mathematically that this interchange of the amplifier roles, in switching from one node to another node two points away, eliminates or minimizes differential non-linearity errors which otherwise could occur due to offset mismatch between the amplifiers.

It also will be seen that the switch stepping procedure described above causes a reversal of the polarity of the voltage between the reference leads 28, 30 for each step up (or down) the resistor string. The effects of this reversal are eliminated by the reversing switch arrangement 50 connected in the output circuits of the buffer amplifiers A1, A2. The switch output lines 52, 54 are connected to the input terminals 56, 58 of the second stage converter 12. These switches are driven, as indicated by arrow 60, in response to changes in the higher-order bits of the digital input signal, such that the polarity of the voltage delivered to the second-stage input terminal 56, 58 will always be the same. It may be further noted that all of the changeover switching occurs within the feedback loop of each amplifier, so that there is negligible effect due to the on-resistance of the switches.

In accordance with a further aspect of the invention, the second-stage converter 12 comprises a known converter of the type employing an R/2R ladder, with the operating switches being of CMOS type and operated in the voltage mode. A circuit diagram of the overall DAC arrangement is set forth in FIG. 3, with a truth table for the switches set out in FIG. 4. This device is designed to provide an overall resolution of 16 bits. The four higher-order bits control the first-stage segment converter 10, and the remaining twelve bits control the switched R/2R ladder of the second stage 12, as indicated by the arrow 62.

FIG. 5 illustrates the voltage switching arrangement for the R/2R ladder, showing only a limited number of the twelve bit switches actually included in the CMOS DAC. The input terminals 56, 58 receive the voltage from the buffer amplifiers A1, A2 previously described, and deliver corresponding potentials to a pair of supply leads 64, 66. The DAC includes a plurality of switches illustrated at 68, to connect the shunt legs of the R/2R ladder to one or the other of the supply leads in accordance with the twelve-bit digital signal.

The output voltage $v_o$ will be equal to $D \cdot V_{in}$, where:

$$D = (B_1/2) + (B_2/4) \ldots + (B_n/2^n)$$

$$B_i = 0 \text{ or } 1$$

Such a second-stage DAC advantageously affords constant output impedance, with the R/2R ladder effectively serving as a voltage divider. The disclosed circuit is superior in a number of ways with respect to that shown in the Gryzbowski et al article referred to above. For example, the R/2R ladder arrangement avoids the need for a second $2^n$ resistor DAC, thereby saving a significant amount of logic and die area when developed in integrated circuit format. Any requirement for a ladder termination switch is eliminated. The new arrangement also eliminates any need to switch the bias connection to the P− well containing the N-channel D/A converter switches.

Although a preferred embodiment of this invention has been described hereinabove in detail, it is desired to emphasize that this has been for the purpose of illustrating the invention, and should not be considered as necessarily limitative of the invention, it being understood that many modifications can be made by those skilled in the art while still practicing the invention claimed herein.

What is claimed is:

1. In a two-stage digital-to-analog converter wherein the first stage decodes a set of higher-order bits and the second stage decodes the remaining, lower-order bits, said first stage comprising a series-connected string of resistors energized by a reference voltage and including first switch means responsive to said higher-order bits for stepping up or down the string of resistors to make first and second connections respectively to any pair of adjacent nodal points of said resistor string to produce between first and second reference leads any of the voltages appearing across the resistors of said string;

first and second buffer amplifiers having input circuits connected to said reference leads respectively responsive to the selected nodal point voltages to develop a voltage for the input of said second-stage converter;

said first switch means being operable at each step up (or down) the resistor string to interchange the roles of said buffer amplifiers at each step up (or down) the resistor string by switching the connection to only one of said nodal points, connecting the corresponding buffer amplifier to the nodal point next beyond the nodal point to which the other buffer amplifier is connected while leaving said other buffer amplifier with its connection to the resistor string unchanged, whereby said buffer amplifiers are alternatingly connected to the successive nodal points of said resistor string as said first switch means steps the connections up (or down) the string;

reversing switch means connecting the outputs of said buffer amplifiers to respective input terminals of the second stage of said converter;

said reversing switch means being operable in response to the digital input signal to reverse the connections between said amplifier outputs and said second stage input terminals for each step up (or down) the resistor string effected by said first switch means, thereby maintaining a uniform polarity relationship between said second stage input terminals for all settings of said first switch means;

the interchanged roles of said buffer amplifiers produced by said alternating connection of said buffer amplifiers to said successive nodal points serving to minimize differential non-linearity errors which otherwise could occur due to offset mismatch between the buffer amplifiers.

2. Apparatus as claimed in claim 1, wherein each of said buffer amplifiers includes first and second input terminals, and a feedback circuit for connecting a feedback signal to one of the amplifier input terminals.

3. Apparatus as claimed in claim 2, wherein said reversing switch means comprises a first pair of switches connecting the output terminals of said amplifiers alternatively to said second-stage input terminals; and a second pair of switches in said feedback circuits respectively and synchronized with said first pair of switches to provide a feedback signal from the second-stage input terminal to which the corresponding amplifier output is connected.

4. Apparatus as claimed in claim 1, wherein said second-stage converter comprises an R/2R ladder operated in a voltage mode.

5. Apparatus as claimed in claim 4, wherein said ladder includes a pair of supply leads connected to said input terminals respectively; and a plurality of switches connecting the shunt legs of said ladder alternatively to one or the other of said supply leads in accordance with the lower order bits of the digital input signal.

6. Apparatus as claimed in claim 5, wherein said second-stage converter is a CMOS converter employing CMOS voltage switching.

* * * * *